(12) United States Patent
Chung et al.

(10) Patent No.: US 6,231,989 B1
(45) Date of Patent: May 15, 2001

(54) METHOD OF FORMING COATINGS

(75) Inventors: Kyuha Chung; Eric Scott Moyer, both of Midland; Michael John Spaulding, Bay City, all of MI (US)

(73) Assignee: Dow Corning Corporation, Midland, MI (US)

( * ) Notice: Subject to any disclaimer, the term of this patent is extended or adjusted under 35 U.S.C. 154(b) by 0 days.

(21) Appl. No.: 09/197,249

(22) Filed: Nov. 20, 1998

(51) Int. Cl.[7] ............................... B05D 3/04; B32B 18/00
(52) U.S. Cl. ..................... 428/447; 427/226; 427/337; 427/340; 427/341; 427/343; 427/344; 428/209; 428/210; 428/446; 428/901
(58) Field of Search ................................. 427/226, 337, 427/340, 341, 343, 344; 428/209, 210, 446, 447, 901

(56) References Cited

U.S. PATENT DOCUMENTS

| | | | |
|---|---|---|---|
| 4,636,440 | 1/1987 | Jada | 428/446 |
| 4,749,631 | 6/1988 | Haluska et al. | 428/704 |
| 4,756,977 | 7/1988 | Haluska e al. | 428/704 |
| 4,842,888 | 6/1989 | Haluska et al. | 427/38 |
| 4,847,162 | 7/1989 | Haluska et al. | 428/457 |
| 5,116,637 | 5/1992 | Baney et al. | 427/340 |
| 5,262,201 | 11/1993 | Chandra et al. | 427/376.2 |
| 5,523,163 | 6/1996 | Ballance et al. | 428/446 |
| 5,547,703 | 8/1996 | Camilletti et al. | 427/126.3 |
| 5,618,878 | 4/1997 | Syktich et al. | 524/588 |
| 5,753,305 | 5/1998 | Smith et al. | 427/335 |
| 6,074,695 * | 6/2000 | Kobayashi et al. | 427/245 |

FOREIGN PATENT DOCUMENTS

| | | |
|---|---|---|
| 0 775 669 A2 * | 5/1997 | (EP) . |
| 0 869 515 A1 | 10/1998 | (EP) . |
| 0 869 516 A1 | 10/1998 | (EP) . |
| WO 98/46526 | 10/1998 | (WO) . |
| WO 98/47177 | 10/1998 | (WO) . |
| WO 98/49721 | 11/1998 | (WO) . |

OTHER PUBLICATIONS

Journal of Non–Crystalline Solids, 63 (1984) 209–221.

* cited by examiner

Primary Examiner—D. S. Nakarani
(74) Attorney, Agent, or Firm—Roger E. Gobrogge; Rick D. Streu

(57) ABSTRACT

A coating is formed on a substrate by depositing a solution comprising a resin containing at least 2 Si—H groups and a solvent in a manner in which at least 5 volume % of the solvent remains in the coating after deposition followed by exposing the coating to an environment comprising a basic catalyst and water at a concentration sufficient to cause condensation of the Si—H groups and evaporating the solvent from the coating to form a porous network coating. The method of the invention is particularly useful for applying low dielectric constant coatings on electronic devices.

18 Claims, No Drawings

METHOD OF FORMING COATINGS

BACKGROUND OF THE INVENTION

This invention relates to a method of forming a coating on a substrate by depositing a solution of a resin containing Si—H groups and a solvent in a manner in which solvent remains in the coating followed by exposing the coating to a basic catalyst and water and then evaporating the solvent from the coating. The method of the invention is particularly useful for applying low dielectric constant coatings on electronic devices.

Thin film dielectric coatings on electronic devices are known in the art. For instance, Haluska et al. in U.S. Pat. Nos. 4,749,631 and 4,756,977, which are incorporated herein by reference, disclose silica based coatings produced by applying solutions of silicon alkoxides or hydrogen silsesquioxane, respectively, to substrates and then heating the coated substrates to temperatures of 200–1000° C. The dielectric constant of these coatings, however, are often too high for certain electronic devices and circuits.

Haluska et al. in U.S. Patent Nos. 4,847,162 and 4,842,888 also teach the formation of nitrided silica coatings by heating hydrogen silsesquioxane resin and silicate esters, respectively, to a temperatures of between 200 and 1000° C. in the presence of ammonia. These references teach the use of anhydrous ammonia so that the resulting coating has about 1 to 2 % by weight nitrogen incorporated therein.

Glasser et al. in the Journal of Non-Crystalline Solids, 64 (1984) pp. 209–221 teach the formation of ceramic coatings by heating tetraethoxysilane in the presence of ammonia. As with Haluska '162 above, however, this reference also teaches that the ammonia should be anhydrous and that the resultant silica coatings are nitrided.

Jada in U.S. Pat. No. 4,636,440 discloses a method of reducing the drying time for a sol-gel coated substrate comprising exposing the substrate to aqueous quaternary ammonium hydroxide and/or alkanol amine compounds. The methods of this reference, however, are different than those disclosed herein in that Jada requires the coating to be dried prior to heating. Moreover, Jada is specifically limited to hydrolyzed or partially hydrolyzed silicon alkoxides and fails to teach the utility of the process on coatings having Si—H bonds.

Haluska et al. in U.S. Pat. No 5,262,201 and Baney et al. In U.S. Pat. No. 5,116,637 teach the use of basic catalysts to lower the temperature necessary for the conversion of various preceramic materials, including hydrogen silsesquioxane, to ceramic coatings. These references, however, teach the removal of solvent before the coating is exposed to the basic catalysts.

Camilletti et al. in U.S. Pat. No. 5,547,703 teach a method for forming low dielectric constant Si—O containing coatings on substrates comprising heating a hydrogen silsesquioxane resin successively under wet ammonia, dry ammonia and oxygen. The resultant coatings have dielectric constants as low as 2.42 at 1 MHz. Again, however, this reference teaches the removal of solvent before converting the coating to a ceramic and the dielectric constant of the resultant coatings are not as low as those disclosed herein.

Ballance et al. in U.S. Pat. No. 5,523,163 teach a method for forming Si—O containing coatings on substrates comprising heating a hydrogen silsesquioxane resin to convert it to a Si—O containing ceramic coating and then exposing the coating to an annealing atmosphere containing hydrogen gas. The resultant coatings have dielectric constants as low as 2.773. Again, however, this reference teaches the removal of solvent before converting the coating to a ceramic and the dielectric constant of the resultant coatings are not as low as those disclosed herein.

Syktich et al in U.S. Pat. No. 5,618,878 teach coating compositions containing hydrogen silsesquioxane resin dissolved in saturated alkyl hydrocarbons useful for forming thick ceramic coatings. The alkyl hydrocarbons disclosed are those up to dodecane. The reference, however, fails to teach exposure of coated substrates to basic catalysts before solvent removal.

The present inventors have now discovered that by exposing a Si—H containing resin to basic catalysts before complete solvent removal, porous network coatings with low dielectric constants can be produced.

SUMMARY OF THE INVENTION

In one aspect, the present invention relates to a method of forming a coating on a substrate. The method comprises depositing a coating on a substrate with a solution comprising a resin containing at least 2 Si—H groups and a solvent in a manner in which at least 5 volume % of the solvent remains in the coating after deposition. The coating is then exposed to an environment comprising a basic catalyst and water. Finally, the solvent is evaporated from the coating to form a porous network. If desired, the coating can be heated to form a ceramic.

In other aspects, the present invention relates to the coatings produced by the above method as well as the coating solution used in the process.

DETAILED DESCRIPTION OF THE INVENTION

The present invention is based on the discovery that basic catalysts and water can be used to form novel porous network coatings from Si—H containing resins. Such coatings are useful on electronic substrates because of their low dielectric constant.

The methods of this invention are particularly applicable to the deposition of coatings on electronic devices or electronic circuits where they can serve as interlevel dielectric layers, doped dielectric layers to produce transistor like devices, pigment loaded binder systems containing silicon to produce capacitor and capacitor like devices, multilayer devices, 3-D devices, silicon on insulator devices, super lattice devices, and the like. However, the choice of substrates and devices to be coated by the instant invention is limited only by the need for thermal and chemical stability of the substrate at the temperature and atmosphere used in the present invention. As such, the coatings of the invention can be used on substrates such as plastics including, for example, polyimides, epoxides, polytetrafluoroethylene and copolymers thereof, polycarbonates, acrylics and polyesters, ceramics, leather, textiles, metals, and the like.

As used in the present invention, the expression "ceramic" includes ceramics such as amorphous silica and ceramic-like materials such as amorphous silica-like materials that are not fully free of carbon and/or hydrogen but are otherwise ceramic in character and the expressions "electronic device" or "electronic circuit" include, but are not limited to, silicon based devices, gallium arsenide based devices, silicon carbide based devices, focal plane arrays, opto-electronic devices, photovoltaic cells and optical devices.

The resins containing at least 2 Si—H groups useful in the present invention are not particularly limited so long as the Si—H bonds can be hydrolyzed and at least partially condensed by the basic catalyst and water to form a crosslinked network which serves as the structure for the porous network. Generally, such materials have the formula:

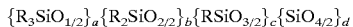
$$\{R_3SiO_{1/2}\}_a\{R_2SiO_{2/2}\}_b\{RSiO_{3/2}\}_c\{SiO_{4/2}\}_d$$

wherein each R is independently selected from the group consisting or hydrogen, alkyl, alkenyl, or aryl groups or alkyl, alkenyl, or aryl groups substituted with a hetero atom such as a halogen, nitrogen, sulfur, oxygen or silicon, and a, b, c and d are mole fractions of the particular unit and the their total is 1, with the proviso that at least 2 R groups per molecule are hydrogen and the material is sufficiently resinous in structure to form the desired network. Examples of alkyl groups are methyl, ethyl, propyl, butyl, and the like with alkyls of 1–6 carbon atoms preferred. Examples of alkeyl groups include vinyl, allyl and hexenyl. Examples of aryls include phenyl. Examples of substituted groups include $CF_3(CF_2)nCH_2CH_2$, (where n=0–6).

Particularly preferred in the present invention are various hydridosiloxane resins, known as hydrogen silsesquioxane resins, comprising units of the formula $HSi(OH)_x(OR)_yO_z/2$. In this formula, each R is as defined above. When these R groups are bonded to silicon through the oxygen atom, they form a hydrolyzable substituent. In the above formula, x=0 to 2; y=0 to 2; z=1 to 3; and x+y+z=3. These resins may be essentially fully condensed $(HSiO_{3/2})_n$ where n is 8 or greater or they may be only partially hydrolyzed (i.e., containing some Si—OR) and/or partially condensed (i.e., containing some Si—OH).

The structure of the resin is not specifically limited. The structure of the resin may be what is generally known at ladder-type, cage-type or mixtures thereof. The resins may contain endgroups such as hydroxyl groups, triorganosiloxy groups, diorganohydrogensiloxy groups, trialkoxy groups, dialkoxy groups and others. Although not represented by the structure, the resins may also contain a small number (e.g. less than about 10%) of the silicon atoms which have either 0 or 2 hydrogen atoms attached thereto and/or a small number of SiC groups such as $CH_3SiO_{3/2}$ or $HCH_3SiO_{2/2}$ groups.

The above resins containing at least 2 Si—H groups and method for their production are known in the art. For example, Collins et al. in U.S. Pat. No. 3,615,272, herein incorporated by reference, teach the production of an essentially fully condensed hydrogen silsesquioxane resin (which may contain up to 100–300 ppm silanol) by a process comprising hydrolyzing trichlorosilane in a benzenesulfonic acid hydrate hydrolysis medium and then washing the resultant resin with water or aqueous sulfuric acid. Similarly, in U.S. Pat. No. 5,010,159 to Bank et al., herein incorporated by reference, teach a method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397; those described by Bergstrom et al. in U.S. Pat. No. 5,210,160, both hereby incorporated by reference, those produced by hydrolyzing an alkoxy or acyloxy silane in an acidic, alcoholic hydrolysis medium; those described in Kokai Patent Nos. 59-178749, 60-86017 and 63-107122; or any other equivalent hydridosiloxane, will also function herein.

In a preferred embodiment of the invention, specific molecular weight fractions of the above hydrogen silsesquioxane resins may also be used in this process. Such fractions and methods for their preparation are taught in U.S. Pat. No. 5,063,267 to Hanneman et al. and in U.S. Pat. No. 5,416,190 to Mine et al., which are hereby incorporated by reference. A preferred fraction comprises material wherein at least 75% of the polymeric species have a molecular weight above about 1200 and a more preferred fraction comprises material wherein at least 75% of the polymeric species have a number average molecular weight between about 1200 and about 100,000.

The hydrogen silsesquioxane resin may contain other components so long as these components do not interfere with the integrity of the coating. It should be noted, however, that certain materials may increase the dielectric constant of the coating. Known additives include catalysts such as platinum, rhodium or copper catalyst which increase the rate and/or extent of cure of the resin as described in U.S. Pat. No. 4,822,697 to Haluska et al., herein incorporated by reference.

Ceramic oxide precursors may also be used in combination with the hydrogen silsesquioxane resin. The ceramic oxide precursors useful herein include compounds of various metals such as aluminum, titanium, zirconium, tantalum, niobium and/or vanadium as well as various non-metallic compounds such as those of boron or phosphorous which may be dissolved in solution, hydrolyzed and subsequently pyrolyzed at relatively low temperature to form ceramic oxides. Ceramic oxide precursors useful herein are described in U.S. Pat. Nos. 4,808,653, 5,008,320 and 5,290,394, herein incorporated by reference.

The above Si—H containing resins are applied to the substrates as solvent dispersions. Solvents which may be used include any agent or mixture of agents which will dissolve or disperse the resin to form a homogeneous liquid mixture without affecting the resulting coating or the substrate. These solvents can include alcohols such as ethyl alcohol or isopropyl alcohol; aromatic hydrocarbons such as benzene or toluene; branched or linear alkanes such as n-heptane, dodecane or nonane; branched or linear alkenes such as n-heptane, dodecene or tetradecene; ketones such as methyl isobutyl ketone; esters; ethers such as glycol ethers; or siloxanes such a linear (e.g. hexamethyldisiloxane, octamethyldisiloxane and mixtures thereof), cyclic dimethylpolysiloxanes, or mixtures of any of the above solvents. The solvent is generally present in an amount sufficient to dissolve/disperse the resin to the concentration desired for application. Typically the solvent is present in an amount of 20 to 99.9 wt %, preferably from 70 to 95 wt % based on the weight of resin and solvent.

If desired, other materials can be included in the resin dispersion. For instance, the dispersion can include fillers, colorants, adhesion promoters and the like.

Specific methods for application of the resin dispersion to the substrate include, but are not limited to spin coating, dip coating, spray coating, flow coating, screen printing or others. The preferred method for application is spin coating.

It is critical to the present invention that at least 5 volume % of the solvent remain in the coating until the resin is contacted with the basic catalyst and water. This solvent forms the pores of the porous network coating as the Si—H bonds are hydrolyzed and condensed. In some embodiments, it may be preferable that at least 10 volume % solvent remains. In other embodiments, it may be preferable that at least 15 volume % solvent remains. In still other embodiments, it may be preferable that at least 25 volume % solvent remains.

The method of retaining the solvent is not particularly restricted. In one preferred embodiment, a high boiling point solvent is used alone or as a co-solvent with one of the solvents described above. In this manner, processing the resin dispersion as described above under normal conditions allows for at least 5% residual solvent remaining. Preferred high boiling point solvents to be used in this embodiment of the invention are those with a boiling point above 175° C. Examples of such solvents include hydrocarbons, aromatic hydrocarbons, esters; ethers, and the like. Examples of specific solvents which can be used in this embodiment of the invention include saturated hydrocarbons, such as dodecane, tetradecane, hexadecane, etc., unsaturated hydrocarbons such as dodecene, tetradecene, etc., xylenes, mesitylene, 1-heptanol, dipentene, d-limonene, tetrahydrofurfuryl alcohol, mineral spirits, 2-octanol, stoddard solvent, Isopar H™, diethyl oxalate, diamyl ether, tetrahydropyran-2-methanol, lactic acid butyl ester, isooctyl alcohol, propylene glycol, diproylene glycol monomethyl ether, diethylene glycol diethyl ether, dimethyl sulfoxide, 2,5-hexanedione, 2-butoxyethanol acetate, diethylene glycol monomethyl ether, 1-octanol, ethylene glycol, Isopar L™, dipropylene glycol monomethyl ether acetate, diethylene glycol monoethyl ether, N-methylpyrrolidone, ethylene glycol dibutyl ether, gamma-butyrolactone, 1,3-butanediol, diethylene glycol monomethyl ether acetate, trimethylene glycol, triethylene glycol dimethyl ether, diethylene glycol monoethyl ether acetate, alpha-terpineol, n-hexyl ether, kerosene, 2-(2-n-butoxyethoxy)ethanol, dibutyl oxalate, propylene carbonate, propylene glycol monophenyl ether, diethylene glycol, catechol, diethylene glycol monobutyl ether acetate, ethylene glycol monophenyl ether, diethylene glycol dibutyl ether, diphenyl ether, ethylene glycol monobenzyl ether, hydroquinone, sulfolane and triethylene glycol. Hydrocarbon solvents are particularly preferred.

In a second preferred embodiment of the invention, the above processing (i.e., primarily deposition of the coating solution) is done in an environment which inhibits solvent evaporation prior to contact with the basic catalyst and water. For example, the spin coating can be performed in a closed environment such that the subsequent steps of this invention (i.e., contact with the basic catalyst and water) can occur before the solvent is completely evaporated.

The coating containing at least 5 volume % solvent is then contacted with a basic catalyst and water. Examples of basic catalysts include ammonia, ammonium hydroxide, as well as amines. The amines useful herein may be primary amines ($RNH_2$), secondary amines ($R_2NH$) and/or tertiary amines ($R_3N$) in which R is independently (1) a saturated or unsaturated aliphatic such as methyl, ethyl, propyl, vinyl, allyl, ethynyl etc., (2) an alicyclic such as cyclohexylmethyl, (3) an aromatic such as phenyl, (4) a substituted hetero atom such as oxygen, nitrogen, sulfur etc. or (5) compounds in which the nitrogen atom is a member of a heterocyclic ring such as quinoline, pyrrolidine or pyridine. In addition, any of the above amine compounds may be substituted with other hydrocarbon and/or hetero containing groups to form compounds such as diamines, amides etc. Finally, it is also contemplated that compounds which are converted to amines under the reaction conditions used would function in an equivalent manner. For example, a compound such as an ammonium salt which yields an amine upon dissolution would provide the desired catalytic effect.

Examples of the specific amines that may be used herein include methylamine, ethylamine, butylamine, allylamine, cyclohexylamine, aniline, dimethylamine, diethylamine, dioctylamine, dibutylamine, methylethylamine, saccharin, piperidine, trimethylamine, triethylamine, pyridine, diethyl toluidene ethylmethylpropylamine, imidazole, choline acetate, triphenyl phosphene analine, trimethylsilylimidazole, ethylenediamine, diethylhydroxylamine, triethylenediamine, n-methylpyrolidone etc.

The basic catalyst can generally be used at any concentration sufficient to catalyze hydrolysis of the Si—H bonds. Generally, concentrations of the basic catalyst can be from 1 ppm to 100 wt. % based on the weight of the resin, depending on the basic catalyst.

The water to be used in the invention can be that present in an ambient environment (e.g., >25% relative humidity), the ambient environment can be supplemented with additional water vapor (e.g., relative humidity up to 100%), water can be used as a liquid, or a compound which generates water under the reaction conditions can be used.

Contact of the coating with the basic catalyst and water can be accomplished by any means practical or desirable. For instance, the coating can be contacted with vapors of the basic catalyst and water vapor. Alternatively, the coating can be contacted with the basic catalyst and water in the liquid state. For instance, the coating can be immersed in a basic catalyst solution containing water.

In a preferred embodiment of this invention, the resin coating is exposed to an environment comprising the basic catalyst and water in their vapor state. Exposure to the above conditions can be by any practical means. In a more preferred embodiment, the resin coating is exposed to ammonia and water vapor.

In this preferred embodiment, the coated substrate may, for instance, simply be placed in a container and the appropriate environment introduced therein or, alternatively, a stream of the basic catalyst and water may simply be directed at the coating.

The method used to generate the basic catalyst and water environment in this preferred embodiment is also generally not significant Methods such as bubbling the basic catalyst (e.g., ammonia gas) through water or ammonium hydroxide solutions (to control the amount of water vapor present), heating a basic catalyst and water, or heating water and introducing the basic catalyst gas (e.g., ammonia gas) are all functional herein. It is also contemplated that methods which generate basic catalyst vapors in situ such as the addition of water to amine salts or the addition of water to a silazane such as hexamethyldisilazane will also be effective.

The basic catalyst used in this preferred embodiment may be at any concentration desired. For example, the concentration may be from about 0.01 up to a saturated atmosphere.

The exposure in this preferred embodiment of the invention can be at any temperature desired from about room temperature up to about 300° C. Generally, the temperature is in the range of from about 20 up to about 200° C. is preferred with a range of from about 20 up to about 100° C. being preferred.

The resin coating should be exposed to the basic catalyst and water environment in this preferred embodiment of the invention for the time necessary to hydrolyze the Si—H groups to form silanols (Si—OH) and for the silanols to at least partially condense to form Si—O—Si bonds. Generally, exposures of up to about 20 minutes are preferred, with exposures of at least about 1 second up to about 5 minutes being more preferred. It should be noted that if the coatings of the invention are to be used as a dielectric layer, it is generally preferred to have a shorter exposure as longer exposures tend to increase the dielectric constant of the coating.

In an alternative embodiment of the invention, the coating is exposed to basic catalyst and then water in a liquid state.

In a more preferred embodiment, the liquid basic catalyst and water is an ammonium hydroxide solution.

In this embodiment, the basic catalyst and water exposure is usually conducted by merely immersing the coated substrate in a solution. Other equivalent methods, however, such as continuously flushing the coating with a basic catalyst and water solution would function as well. In addition, vacuum infiltration may also be used to increase penetration of the basic catalyst and water into the coating.

The basic catalyst solution used in this embodiment may be at any concentration desired. Generally, when ammonium hydroxide is used, a concentrated aqueous solution (28–30%) is preferred since the duration of exposure is thereby shortened. When dilute solutions are to be used, the diluent is generally water.

Exposure to the basic catatalyst and water solution in this embodiment may be conducted at any temperature and atmospheric pressure desired. Temperatures of from about room temperature (20–30° C.) up to about the boiling point of the basic catalyst solution and atmospheres from below to above atmospheric pressure are all contemplated herein. From a practical standpoint, however, it is preferred that the exposure occur at about room temperature and at about atmospheric pressure.

The resin coating is exposed to the basic catalyst solution in this embodiment of the invention for the time necessary to hydrolyze the Si—H groups to form silanols (Si—OH) and for the silanols to at least partially condense to form Si—O—Si bonds. Generally, exposures of up to about 2 hours are preferred, with exposures of at least about 1 second up to about 15 minutes being more preferred.

In another alternative embodiment of this invention, the coating is exposed to both a liquid basic catalyst and water environment (e.g., ammonium hydroxide) and a gaseous basic catalyst and water vapor environments (ammonia gas and water vapor). The exposures in this embodiment of the invention may be either sequential or concomitant and are generally under the same conditions as those described above.

After the resin coating is exposed to one of the above environments, the solvent is then removed from the coating. This can be accomplished by any desired means. For instance, the coating can be heated to complete the condensation of silanols formed.

If desired, the resultant coating be subjected to a temperature sufficient convert the coating to a ceramic before, during or after solvent removal. Generally, this temperature is above room temperature with a range of from about 50° C. to about 500° C. being preferred. Higher temperatures usually result in quicker and more complete conversion to a ceramic, but this temperatures also may have detrimental effects on various temperature sensitive substrates. The coatings are usually subjected to these temperatures for a time sufficient to ceramify the coating, generally up to about 6 hours, with a range of between about 5 minutes and about 6 hours being preferred, and a range of between about 10 minutes and 2 hours being more preferred.

The above heating may be conducted at any effective atmospheric pressure from vacuum to superatmospheric and under any effective gaseous environment such as an inert gas ($N_2$, etc.). It is especially preferred, however, to heat under a nitrogen atmosphere.

It is also contemplated by the above description that the resin coating may be simultaneously exposed to the basic catalyst and water environment (liquid or gaseous) and subjected to a temperature sufficient to convert it to a ceramic. The time and temperature for said exposure as well as that necessary for said ceramification are generally the same as those described above.

Any method of heating such as the use of a convection oven or radiant or microwave energy is generally functional herein. The rate of heating, moreover, is also not critical, but it is most practical and preferred to heat as rapidly as possible.

In a typical procedure, a substrate is coated with the Si—H containing resin and solvent in a manner which insure that at least 5 volume % of the solvent remains in the coating, the coated substrate is then exposed to the basic catalyst and water, the solvent is evaporated and the coated substrate is placed in a convection oven. The oven environment is filled with an inert gas such as nitrogen. The temperature in the oven is then raised to the desired level (such as about 450° C.) and maintained for the desired time under inert atmosphere (such as about 5 minutes–2 hours).

By the above methods a thin (less than 5 microns) ceramic coating is produced on the substrate. The coating smooths the irregular surfaces of various substrates and has excellent adhesion. In addition, the coating may be covered by other coatings such as further $SiO_2$ coatings, $SiO_2$/modifying ceramic oxide layers, silicon containing coatings, silicon carbon containing coatings, silicon nitrogen containing coatings, silicon nitrogen carbon containing coatings and/or diamond like carbon coatings.

Coatings produced by the instant invention possess low defect density and are useful on electronic devices as dielectric layers in, for instance, multilayer devices.

The following non-limiting examples are included so that one skilled in the art may more readily understand the invention.

EXAMPLE 1

H-resin, prepared by the method of Collins et al., U.S. Pat. No. 3,615,272, was diluted to 26 weight percent solids in methylisobutylketone. The H-Resin/methylisobutylketone solution was diluted with tetradecane to form the series of solutions listed in Table 1. 4 inch diameter 1 mOhm-cm, n-type, silicon wafers were coated with each of the solutions listed in Table 1 by spinning at 3000 rpms for 20 seconds.

The coated silicon wafers were exposed to an ammonia atmosphere with ambient moisture for 30 seconds and then heated for 10 minutes in nitrogen at 450° C. Table 2 shows the effect of tetradecane content remaining in the films on the resulting dielectric constant.

TABLE 1

| Solution Number | Parts Per Hundred Tetradecane Added | Weight % Tetradecane in Solution |
|---|---|---|
| 1 | 0 | 0 |
| 2 | 5 | 4.76 |
| 3 | 10 | 9.09 |
| 4 | 15 | 13.04 |
| 5 | 20 | 16.67 |
| 6 | 30 | 23.07 |

TABLE 2

| Solution Number | Measured Volume % Tetradecane | Max. Theoretical Volume % Tetradecane | Dielectric Constant |
|---|---|---|---|
| 1 | 0 | 0 | 3.0 |
| 2 | 15.9 | 21.1 | 2.97 |
| 3 | 24.4 | 36.4 | 2.49 |

TABLE 2-continued

| Solution Number | Measured Volume % Tetradecane | Max. Theoretical Volume % Tetradecane | Dielectric Constant |
|---|---|---|---|
| 4 | 44.7 | 48.0 | 2.16 |
| 5 | 52.8 | 57.0 | 1.91 |
| 6 | 60.5 | 70.2 | 1.71 |

EXAMPLE 2

H-resin, prepared by the method of Collins et al., U.S. Pat. No. 3,615,272, was diluted to 26 weight percent solids in methylisobutylketone. The H-Resin/methylisobutylketone solution was diluted with 30 parts per hundred or 23 weight percent tetradecane. Two 4 inch diameter 1 mOhm-cm, n-type, silicon wafers were coated with the solution by spinning at 3000 rpms for 20 seconds. One of the wafers was than exposed to an ammonia atmosphere with ambient moisture for 30 seconds and than heated for 10 minutes in nitrogen at 450° C. The dielectric constant of the film on the wafer was determined to be 1.71. The second wafer was used as a comparative example. It was placed in a vacuum oven at 80° C. for 10 minutes to remove the remaining tetradecane solvent in the film. After solvent removal, the wafer was exposed to an ammonia atmosphere with ambient moisture for 30 seconds and than heated for 10 minutes in nitrogen at 450° C. The dielectric constant of the second wafer was determined to be 2.97.

EXAMPLE 3

H-resin, prepared by the method of Collins et al., U.S. Pat. No. 3,615,272, was diluted to 26 weight percent solids in methylisobutylketone. The H-Resin/methylisobutylketone solution was diluted with different high boiling point solvents to form the series of solutions listed in Table 3. 4 inch diameter 1 mOhm-cm, n-type, silicon wafers were coated with each of the solutions listed in Table 3 by spinning at 3000 rpms for 20 seconds.

The coated silicon wafers were exposed to an ammonia atmosphere with ambient moisture for 30 seconds and then heated for 10 minutes in nitrogen at 450° C. Table 4 shows the effect of various boiling point solvents on the resulting dielectric constant of the films.

TABLE 3

| Solution Number | Solvent (Weight %) | Boiling Point |
|---|---|---|
| 1 | 100% MIBK | 117.4 |
| 2 | propylene glycol methyl ether (16.6%) | 120 |
| 3 | propylene glycol n-butyl ether (16.6%) | 171 |
| 4 | tetradecane (16.6%) | 254 |

TABLE 4

| Solution Number | Dielectric Constant |
|---|---|
| 1 | 3.0 |
| 2 | 3.3 |
| 3 | 3.2 |
| 4 | 1.91 |

EXAMPLE 4

H-resin, prepared by the method of Collins et al., U.S. Pat. No. 3,615,272, was diluted with methylisobutylketone or octamethyltetrasiloxane, as listed in Table 5, to the concentration listed in Table 5. The H-Resin/methylisobutylketone or siloxane solution was then diluted with tetradecane in the amount listed in Table 5. 4 inch diameter 1 mOhm-cm, n-type, silicon wafers were coated with each of the solutions listed in Table 5 by spinning at the speed and for the time listed in Table 5.

The coated silicon wafers were exposed to an ammonia atmosphere with ambient moisture for the time indicated in Table 5 and then heated for 10 minutes in nitrogen at 450° C. Table 6 shows the effect of various boiling point solvents on the resulting dielectric constant of the films.

TABLE 5

| | Solution | | | | Spin | | NH3 Tx |
|---|---|---|---|---|---|---|---|
| Soln # | RESIN (g) | MIBK[1] (g) | OMTS[2] (g) | C14H30 (g) | speed (rpm) | time (sec) | time (sec) |
| 1 | 1.8 | 8.2 | — | 2 | 2000 | 20 | 15 |
| 2 | | | — | 2.5 | 2000 | 20 | 15 |
| 3 | | | — | 3 | 2000 | 20 | 15 |
| 4 | 2.6 | 7.4 | — | 2 | 3000 | 20 | 15 |
| 5 | | | — | 2.5 | 3000 | 20 | 15 |
| 6 | | | — | 3 | 3000 | 20 | 15 |
| 7 | 2.6 | 7.4 | — | 2 | 3000 | 20 | 30 |
| 8 | | | — | 2.5 | 3000 | 20 | 30 |
| 9 | | | — | 3 | 3000 | 20 | 30 |
| 10 | 3.3 | — | 6.7 | 2 | 3000 | 20 | 30 |
| 11 | | — | | 2.5 | 3000 | 25 | 30 |
| 12 | | — | | 3 | 3000 | 30 | 30 |

[1]- methylisobutyl ketone
[2]- octamethyltetrasiloxane

TABLE 6

| | | Properties | | | | | |
|---|---|---|---|---|---|---|---|
| | | Thickness (A) | | Refractive Index | | Dielectric Constant | |
| Wafer | Soln # | Avrg | St. Dev. | Avrg | St. Dev | Avrg | St. Dev |
| 1-1 | 1 | 10101 | 72 | 1.148 | 0.002 | 1.85 | 0.08 |
| 1-2 | 1 | 9548 | 52 | 1.157 | 0.003 | 1.94 | 0.11 |
| 2-1 | 2 | 10871 | 113 | 1.121 | 0.001 | 1.69 | 0.02 |
| 2-2 | 2 | 10699 | 119 | 1.124 | 0.001 | 1.63 | 0.03 |
| 3-1 | 3 | 11189 | 80 | 1.107 | 0.007 | 1.56 | 0.04 |
| 3-2 | 3 | 11586 | 105 | 1.105 | 0.001 | 1.54 | 0.04 |
| 4-1 | 4 | 11416 | 728 | 1.19 | 0.065 | 2.24 | 0.02 |
| 4-2 | 4 | 11323 | 290 | 1.185 | 0.01 | 2.04 | 0.02 |
| 5-1 | 5 | 11283 | 188 | 1.161 | 0.005 | 2.18 | 0.04 |
| 5-2 | 5 | 11503 | 253 | 1.159 | 0.005 | 1.85 | 0.04 |
| 6-1 | 6 | 11844 | 268 | 1.14 | 0.003 | 1.75 | 0 |
| 6-2 | 6 | 11508 | 200 | 1.14 | 0.04 | 1.88 | 0.08 |
| 7-1 | 7 | 11101 | 429 | 1.203 | 0.059 | 2.23 | 0.09 |
| 7-2 | 7 | 11360 | 322 | 1.212 | 0.081 | 2.23 | 0.04 |
| 8-1 | 8 | 11452 | 207 | 1.185 | 0.066 | 2.17 | 0.06 |
| 8-2 | 8 | 11626 | 143 | 1.159 | 0.004 | 2.25 | 0 |
| 9-1 | 9 | 11544 | 137 | 1.142 | 0.002 | 1.69 | 0.01 |
| 9-2 | 9 | 11894 | 121 | 1.139 | 0.002 | 1.75 | 0.02 |
| 10-1 | 10 | 11019 | 235 | 1.212 | 0.009 | 2.12 | 0.03 |
| 10-2 | 10 | 11210 | 134 | 1.214 | 0.004 | 1.99 | 0.02 |
| 11-1 | 11 | 11727 | 153 | 1.196 | 0.004 | 2.1 | 0.07 |
| 11-2 | 11 | 11474 | 160 | 1.188 | 0.003 | 2.01 | 0.04 |
| 12-1 | 12 | 11198 | 185 | 1.178 | 0.005 | 2.06 | 0.03 |
| 12-2 | 12 | 11296 | 335 | 1.177 | 0.011 | 1.83 | 0.03 |

That which is claimed is:
1. A method of forming a coating on a substrate comprising:
   depositing a coating on a substrate with a solution comprising a resin containing at least 2 Si—H groups and a solvent in a manner in which at least 5 volume % of the solvent remains in the coating after deposition;

exposing the coating to an environment comprising a basic catalyst and water at a concentration sufficient to cause hydrolysis of the Si—H groups and at least partial condensation; and evaporating the solvent from the coating to form a porous network coating.

2. The method of claim 1 wherein the porous network coating is heated to a temperature sufficient to convert the coating to a ceramic.

3. The method of claim 1 wherein the resin containing at least 2 Si—H groups has the formula:

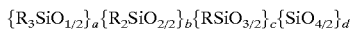

$\{R_3SiO_{1/2}\}_a\{R_2SiO_{2/2}\}_b\{RSiO_{3/2}\}_c\{SiO_{4/2}\}_d$ wherein each R is independently selected from the group consisting of hydrogen, alkyl, alkenyl, and aryl groups or alkyl, alkenyl, and aryl groups substituted with halogen, nitrogen, oxygen sulfur or silicon atoms, with the proviso that at least 2 R groups are hydrogen.

4. The method of claim 3 wherein the resin comprises hydrogen silsesquioxane resin of the structure selected from the group consisting of $(HSiO_{3/2})_n$, a polymer having units of the formula $HSi(OH)_aO_{3-x/2}$ and a polymer having units of the formula $HSi(OH)_x(OR)_yO_{z/2}$, wherein each R is independently an organic group which, when bonded to silicon through the oxygen atom, forms a hydrolyzable substituent, a=0–2, x=0–2, y=0–2, z=1–3, x+y+z=3, n is an integer greater than 3 and the average value of y over all of the units of the polymer is greater than 0.

5. The method of claim 1 wherein the solvent is selected from the group consisting of alcohols, aromatic hydrocarbons, alkanes, alkenes, ketones, esters, ethers or mixtures thereof and is present in an amount sufficient to dissolve the hydrogen silsesquioxane to between about 0.1 and about 95 weight percent.

6. The method of claim 5 wherein the solvent has a boiling point greater than 175° C.

7. The method of claim 5 wherein the solvent is a mixture of solvents and at least one of the solvents has a boiling point greater than 175° C.

8. The method of claim 6 wherein the solvent with a boiling point greater than 175° C. is a hydrocarbon.

9. The method of claim 7 wherein the solvent with a boiling point greater than 175° C. is a hydrocarbon.

10. The method of claim 2 wherein the coating is heated to a temperature of about 50 to about 500° C. for up to about 6 hours.

11. The method of claim 1 wherein the substrate is coated in a closed system to inhibit evaporation of the solvent.

12. The method of claim 1 wherein the coating is exposed to ammonia and water vapors for up to about 4 hours at a temperature of between about 20° C. and about 300° C.

13. The coating prepared by the method of claim 1.

14. An electronic device containing a coating prepared by the method of claim 1.

15. An electronic circuit containing a coating prepared by the method of claim 1.

16. A coating composition comprising a resin containing at least 2 Si—H groups and a solvent having a boiling point higher than 175° C.

17. A coating on a semiconductor substrate produced from a resin containing at least 2 Si—H groups, wherein the coating has a dielectric constant of from 1.1 to 2.4.

18. The coating of claim 17 wherein the coating has a dielectric constant of from 1.5 to 2.2.

* * * * *